United States Patent [19]

Castera et al.

[11] Patent Number: 4,565,984

[45] Date of Patent: Jan. 21, 1986

[54] FILTER DEVICE UTILIZING MAGNETOSTATIC WAVES

[75] Inventors: Jean-Paul Castera, Orsay; Jean-Marie Dupont, Les Ulis, both of France

[73] Assignee: Thomson-CSF, Paris, France

[21] Appl. No.: 614,156

[22] Filed: May 25, 1984

[30] Foreign Application Priority Data

May 27, 1983 [FR] France ................................ 83 08828

[51] Int. Cl.$^4$ ........................ H03H 9/24; H03H 9/48; H01P 1/203
[52] U.S. Cl. ..................................... 333/202; 310/26; 333/201; 333/205; 333/219; 333/246
[58] Field of Search ...................... 333/24.1, 141, 147, 333/148, 150–155, 193–196, 201, 202, 219, 222, 223, 246, 142–145, 204, 205; 310/26, 313 R, 313 A, 313 B, 313 C, 313 D; 331/107 A; 364/819–824

[56] References Cited

U.S. PATENT DOCUMENTS 4,395,686 7/1983 Adam ................................ 333/151

Primary Examiner—Marvin L. Nussbaum
Attorney, Agent, or Firm—Oblon, Fisher, Spivak, McClelland & Maier

[57] ABSTRACT

The invention relates to devices utilizing magnetostatic waves. The invention has as its object a filter microtape which is able to pick up and selectively dissipate magnetostatic waves as a function of their wavelength. The filter microtape is permeable to waves of which the wavelength is a submultiple of its width. The invention is applicable in particular to tunable magnetostatic wave devices such as delay lines, resonators and oscillators.

10 Claims, 10 Drawing Figures

FILTER DEVICE UTILIZING MAGNETOSTATIC WAVES

BACKGROUND OF THE INVENTION

The present invention relates to devices utilizing the propagation of magnetostatic waves along a ferrimagnetic layer deposited on a substrate. Amongst these devices, there are some which operate by means of transducers in the form of microtapes to transmit or receive magnetostatic surface or volume waves. In particular, the invention relates to filter devices which, within a wide frequency range permit selective transmission of magnetostatic waves having a predetermined wavelength. As a matter of fact, magnetostatic wave devices are tunable by means of a magnetic field and may operate at a given wavelength while retaining the option of changing the frequency. The problem which arises is that of attenuating the transmission of the magnetostatic waves at wavelengths differing from a preselected value, this problem being encountered in particular applications in which a reflector network or a cavity resonator determine an operating wavelength by geometrical dimensioning, to which a frequency range may correspond. This feature of magnetostatic waves results from the dispersive properties and from tuning by magnetic fields, which characteristics have no equivalent in the devices utilizing elastic waves where the speed of propagation of the Rayleigh waves is constant. In the sphere of magnetostatic wave devices, it is known that the magnetostatic waves of which the wavelength differs from an assigned value may be attenuated during transmission or reception by adopting a configuration in which the microtapes are folded into a U-shape. This technique is only applicable to a limited frequency range, since it presupposes that the currents flowing in the two branches of the U, spaced apart by $\lambda/2$, are in phase opposition.

The solutions which consist in making use of a configuration of transmission or reception transducers, such that transmission at the great magnetostatic wavelengths is diminished, have the disadvantage of introducing a delay which does not depend on the magnetic field establishing frequency tuning. In an arrangement comprising a tunable oscillator, this disadvantage tends to reduce the tuning range and to give rise to sudden mode variations.

The filter devices according to the invention enable alleviation of the disadvantages referred to in the foregoing.

SUMMARY OF THE INVENTION

The invention proposes that a conductive microtape be introduced on the propagation path of the magnetostatic waves, of which the width provides a transducing action practically equal to zero at the magnetostatic wavelength $\lambda$, but which assumes importance as soon as the wavelength varies from the value it is wished to transmit free of loss. The wavelengths for which the transducer action is sizable are thus attenuated thanks to an appropriate dissipator means which cooperates with the microtape. This microtape forms a filter device having a narrow "transmission window" which coincides with a wavelength for elimination of the transducer action which may develop at other wavelengths.

The invention provides a filter device transmitting magnetostatic waves of predetermined wavelength, these magnetostatic waves being propagated in a magnetic layer epitaxied on to a non-magnetic layer, characterised in that it comprises at least one microtape positioned along the path of the said waves; the width of the said microtape being equal to a multiple of the wavelength which is to be selectively transmitted; dissipator means associated with the said microtape dissipating the energy originating from the interaction of the magnetostatic waves with the said microtape.

BRIEF DESCRIPTION OF THE DRAWINGS

A better understanding of the invention will be gained from the following description and accompanying drawings, in which.

DESCRIPTION OF THE PREFERRED EMBODIMENTS

The frequency of the directional volume magnetostatic waves is related to the applied magnetic field H by the formula:

$$f = \gamma \left\{ (H - 4\pi M)\left[ H - \left(\frac{a^2}{1+a^2}\right) 4\pi M \right] \right\}^{\frac{1}{2}}$$

in which $\gamma$ is the gyromagnetic ratio, $4\pi M$ is the magnetisation of the material, and in which $\alpha$ is derived from the expression tan $$\left(\frac{\alpha k d}{2}\right) = \frac{1}{\alpha},$$

with $k = 2\pi/\lambda$, $\lambda$ the wavelength and $d$ the thickness of the magnetic layer.

For the backward magnetostatic volume waves, $\alpha$ would verify the relationship: $2 \cotan(\alpha k d) = \alpha - \alpha^{-1}$.

Figure 2:
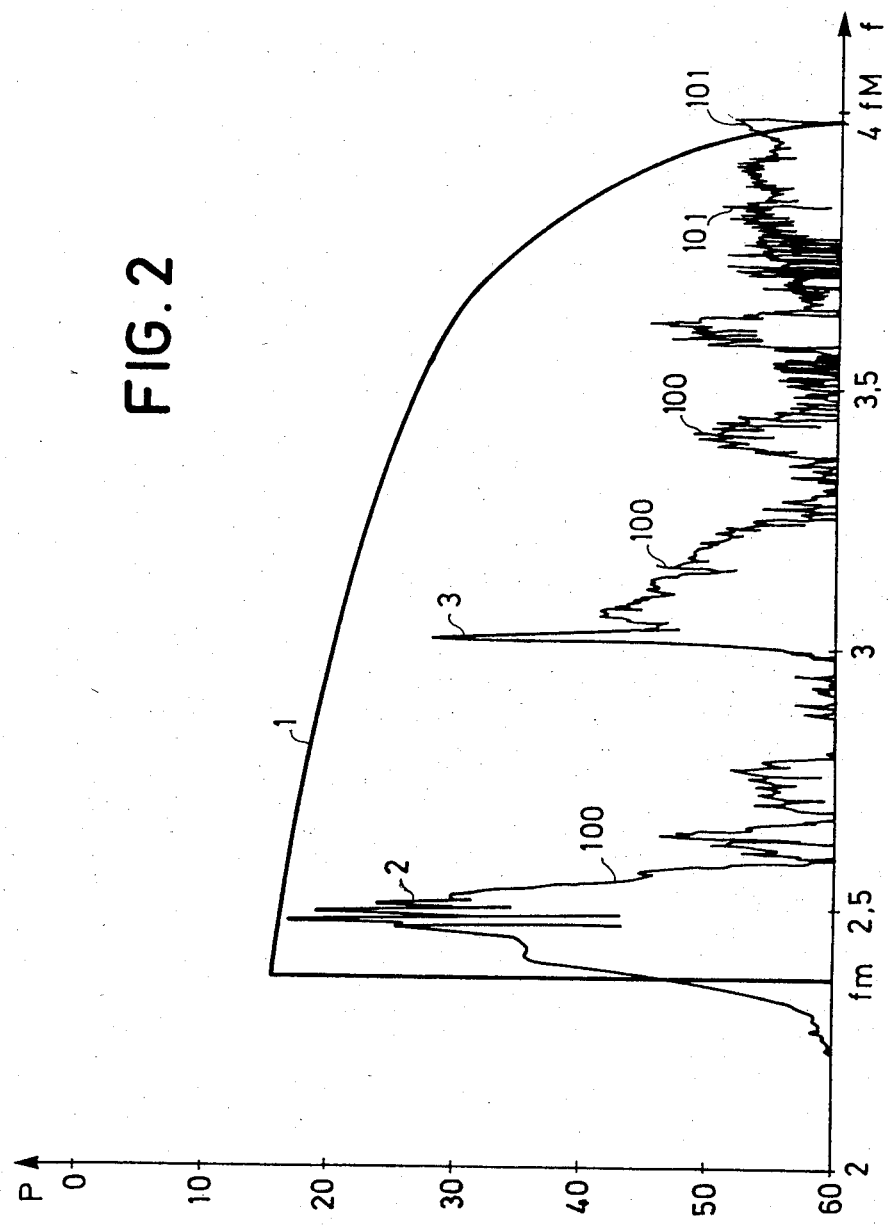
FIG. 2 is an explanatory diagram.

By way of example, in the graph of FIG. 2, the curve 1 represents the transfer function of a magnetostatic wave delay line. This curve shows that the propagation is established with an infinite wavelength at minimum frequency:

$$f_m = \gamma(H - 4\pi M)$$

The maximum frequency $f_M$ is given by the relationship:

$$f_M = \gamma \sqrt{H(H - 4\pi M)}$$

The insertion losses intersect between $f_m$ and $f_M$.

Figure 1:
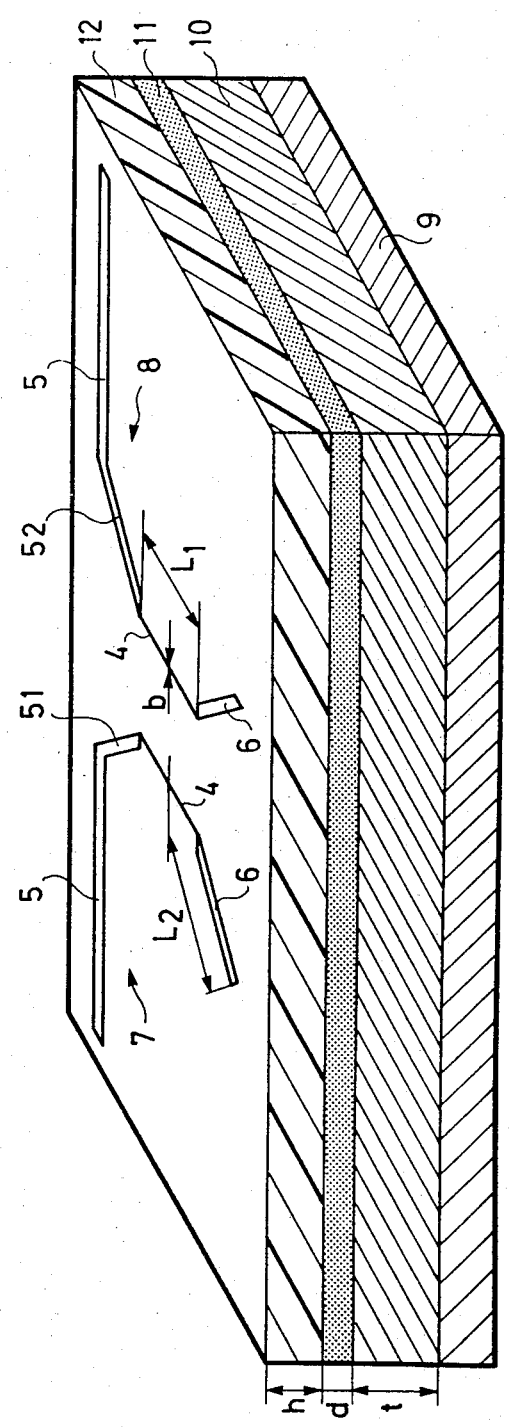
FIG. 1 illustrates a typical arrangement of magnetostatic wave transducers.

FIG. 1 shows a magnetostatic wave transmission line comprising transducers 7 and 8. Each transducer comprises an input or output electrical connection 5 extended by a tape 4 transmitting or receiving magnetostatic waves and which terminates in an electrical connection 6 forming a terminal load. The tapes 4 have a length $L_1$ and a width b. Half the length of the tape 4 added to the length of the terminal connection 6 has the value $L_2$.

The terminal extremities 6 and the parts 51 and 52 of the connections 5 close to the tapes 4 are positioned obliquely to minimise the electromagnetic coupling effect. This electromagnetic coupling is a minimum when the connections 51-52 and the connections 6 of the transducers 7 and 8 are positioned orthogonally. The transducers 7 and 8 are arranged at the surface of a structure comprising a substrate 10 of gadolinium and gallium garnet (GGG) having the thickness t. The back of the substrate 10 is covered by a metal plating 9. A layer 11 of yttrium and iron garnet (YIG) having a thickness d is deposited on the substrate 10. A dielectric layer 12 having the thickness h, acting as a support for the microtapes, is deposited on the YIG layer 11. The GGG layer 10 comprises a metal plating 9 on its lower surface, forming an electrical earth.

FIG. 2 illustrates the transfer function 1 of a delay line and the transfer function 100 of a resonator. These transfer functions which relate to directional (forward) magnetostatic volume wave devices were obtained at a constant magnetic field H. The graphs of FIG. 2 give as a function of the frequency f expressed in GHz, the insertion losses P expressed in dB of a magnetostatic "forward" volume wave device.

A magnetostatic volume wave resonator has been described in French patent application No. 81 24561 filed on the Dec. 31, 1981 by the applicants. The transfer function illustrated by the curve 100 corresponds to operation at the wavelength of 300 μm. At the frequency of 3 GHz, a resonance peak 3 is observed corresponding to insertion losses of 26 dB. The peaks 2 which correspond to lesser insertion losses are observed at frequencies corresponding to great magnetostatic wavelengths.

The parameters t,d,h,b,$L_1$ and $L_2$ illustrated in FIG. 1 serve as a basis for calculation of the insertion losses of a delay line constructed in accordance with the arrangements of FIGS. 1 and 2. To this end, the insertion losses $P_1$ of a transducer such as illustrated by FIG. 1 are calculated, followed by calculating the losses $P_2$ of a delay line comprising two transducers. This establishes:

$$P_1 = 10 \log_{10}\left(\frac{4Ri\,Rg}{(Ri+Rg)^2 + Xi^2}\right)$$

$$P_2 = 20 \log_{10}\left(\frac{(Ri+Rg)^2 + Xi^2}{2Ri\,Rg}\right) + 76,4\Delta HT,$$

P being expressed in dB, $\Delta H$ the width of the line expressed in Oersteds, T is the line delay expressed in microseconds, Rg is the internal resistance of the generator, Ri is the true part of the input impedance of the transducer, Xi is the imaginary part of the transducer impedance. This gives:

$$Ri = \frac{Rm \cdot L_1}{2}$$

$$Xi = Zc \cot an(\beta L_2),$$

where Rm is the radiation resistance of the transducer in question, Zc the characteristic line impedance and β the propagation constant of the electromagnetic waves in the microtape. Zc and β are given by the followng expressions:

$$Z_c = \frac{60}{\sqrt{\epsilon_{eff}}} \ln\left(8\frac{t+d+h}{b} + 0.25\frac{b}{t+d+h}\right)$$

$$\epsilon_{eff} = \frac{\epsilon r + 1}{2} +$$

$$\frac{\epsilon r - 1}{2}\left[\left(1 + 12\frac{t+d+h}{b}\right)^{\frac{1}{2}} + 0.04\left(1 - \frac{b}{t+d+h}\right)^2\right]$$

$$\beta = \frac{2\pi f\sqrt{\epsilon_{eff}}}{c}$$

c is the speed of the light in vacuum and $\epsilon r$ the dielectric constant of the YIG deposited on the GGG. Furthermore, $$\frac{Rm}{2} = \mu_0 \omega j_k^2$$

$j_k$ is the Fourier transformation of the current density, $\mu_o$ is the magnetic permeability and K(h) verifies the formula with $$K(h) = K \exp(-2kh)$$

$$K = \frac{(th^2kt - \mu_{11})(1 - \mu_{11})^{-2}}{2kd\left[th^2kt - \mu_{11} - \frac{t}{d}(1 - th^2kt)\right]}$$

In this formula:

$$\mu_{11} = 1 - \frac{\Omega_H}{\Omega^2 - \Omega^2_H}$$

$$\Omega = \frac{f}{\gamma 4\pi M}$$

$$\Omega_H = \frac{H - 4\pi M}{4\pi M}.$$

and k the wave number.

Taking the preceding formulae as a basis, calculations are undertaken which demonstrate the evolution of the insertion losses of a microtape transducer of the kind illustrated in FIG. 1. The transmission line is of the kind utilising progressive magnetostatic volume waves, making use of two identical transducers. The insertion losses of the line are consequently representative of the inherent insertion losses of the transmission or reception transducer. The calculations performed permit the formation of a set of graphs or diagrams showing the effect of the transmission line parameters on the insertion losses. These diagrams are shown in FIGS. 3 to 7 and express the variation of the insertion losses P in decibels as a function of the frequency f of the magnetostatic waves in GHz. If it is required to keep the parameter considered constant, the frequency variation is accompanied by an intensity variation of the magnetic field polarising the magnetic layer. This applies during an operation at a constant magnetostatic wavelength, but it is obvious that this coordination between the frequency values and the magnetic field values does not affect the electromagnetic wavelength defining the evolution of the current circulating along the microtapes.

Figure 3:
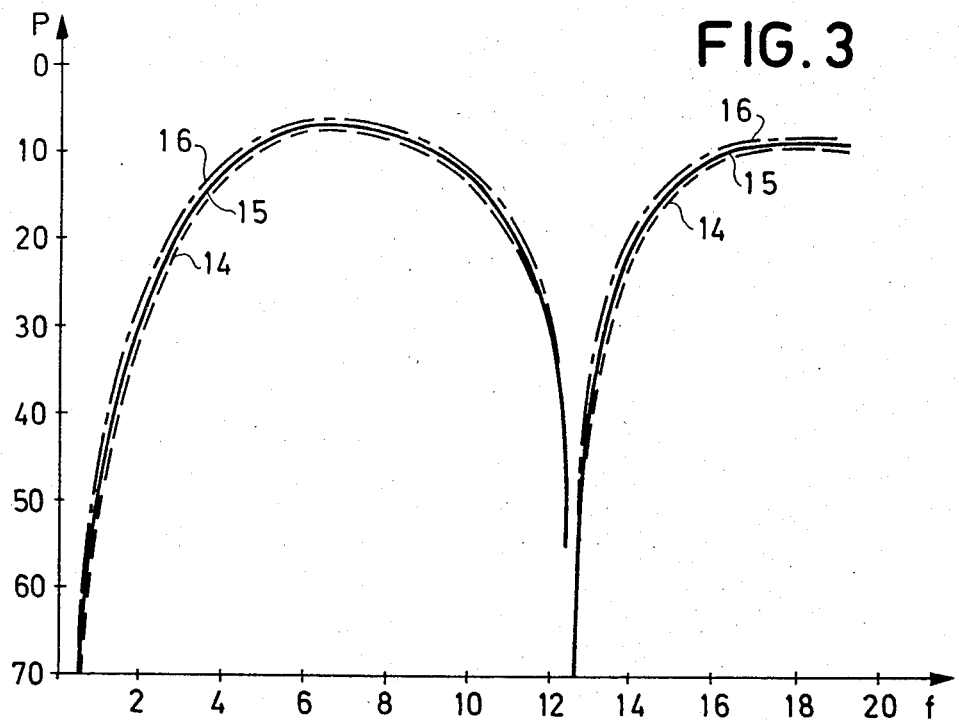
FIGS. 3 to 7 are explanatory diagrams.

FIG. 3 shows the insertion losses P expressed in dB, as a function of the frequency f expressed in GHz of a pair of magnetostatic wave transducers. The frequency variation was associated with a variation of the magnetic field H. The transducers are made with the following dimensions: $b=30$ μm, $L_1=3$ mm, $L_2=4.5$ mm. Moreover, the propagation medium in question is dimensioned as follows: $d=20$ μm, $t=200$ μm, $h=0$.

The curves 14,15 and 16 of FIG. 3 were obtained, respectively, for wavelengths $\lambda=300$ μm, $\lambda=10$ mm and $\lambda=1$ meter. It is apparent that they are practically coincident. Consequently, it is possible to draw the conclusion that the microtape transducer having the width $b=30$ μm is not selective as a function of the magnetostatic wavelength $\lambda$.

It is apparent from FIG. 3 that the curves 14,15 and 16 show a region having high insertion losses close to the 12 GHz frequency, that is to say with a coupling effect practically equal to zero. This amounts to a cutoff effect connected with the current distribution along the transducer. It happens that the system of stationary waves conditional upon the electromagnetic wavelength $\lambda$ gives rise to variations in the opposite direction of the current which cancel the emissive capacity of the microtape.

Figure 4:
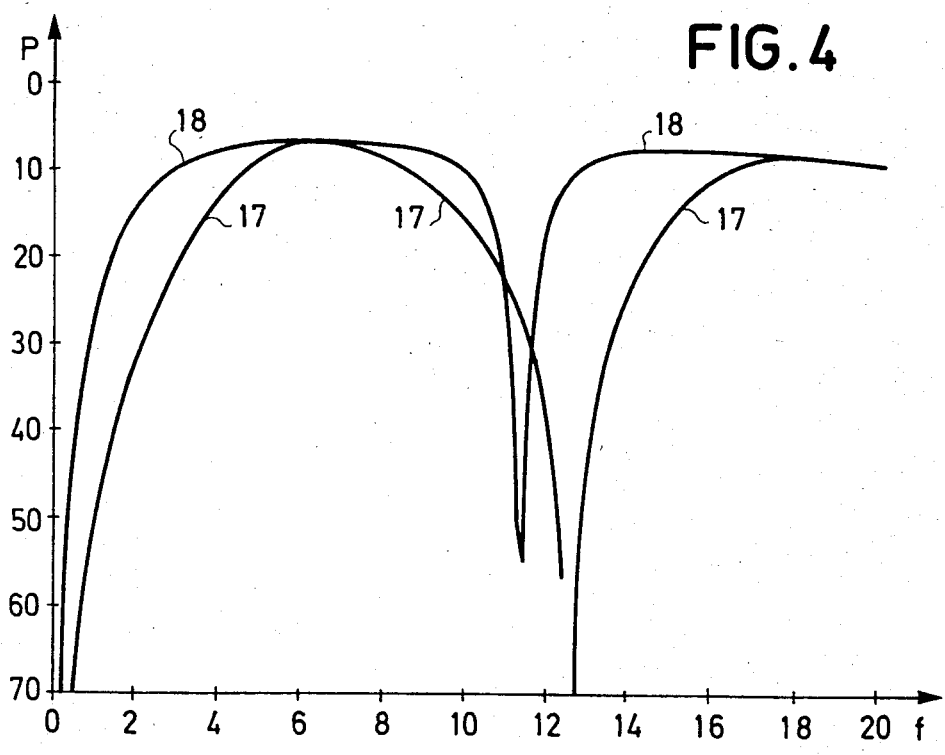

FIG. 4 shows the insertion losses P as a function of the frequency f for a great wavelength equal to 1 meter. The curve 17 corresponds to microtapes of a width $b=30$ μm. The curve 18 corresponds to a width $b=1$ mm.

The other parameters are the following: $d=20$ μm, $t=500$ μm, $h=0$, $L_1=3$ mm, $L_2=4.5$ mm.

It is apparent that if the magnetostatic wavelength is great, a wide microtape causes smaller insertion losses than a narrow microtape of a width $b=30$ μm.

The interpretation of the diagram of FIG. 4 shows that the coupling of the greater wavelength is much more effective with a wide microtape than with a narrow microtape. This consequently leads to implementing the filtering operation with a wide tape for effective absorption of the great wavelengths, but to selecting this width in such a manner that the wavelength $\lambda_r$ which is to be transmitted corresponds to a very weak coupling effect. In accordance with the invention, this condition is established by adopting a microtape width b equal to a multiple of $\lambda_r$. This advantageous arrangement is demonstrated by the diagram of FIG. 5 which illustrates the evolution of the insertion losses for the wavelength $\lambda_r=300$ μm. The diagram of FIG. 5 corresponds to the following parameters: $d=20$ μm, $t=500$ μm, $h=0$, $L_1=3$ mm and $L_2=4.5$ mm.

Figure 5:
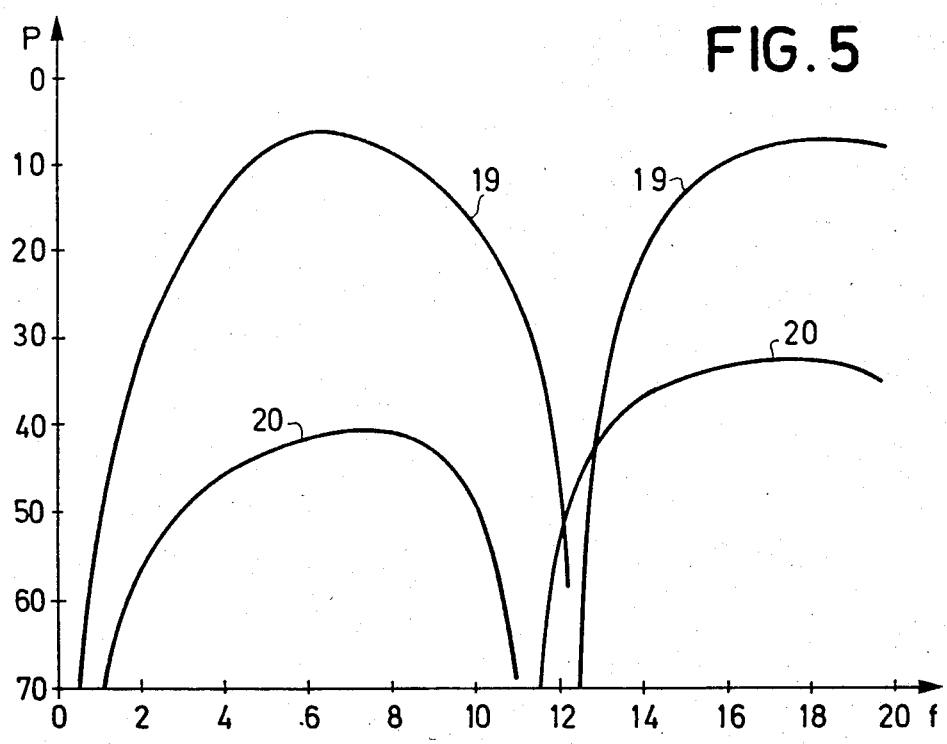

The curve 19 corresponds to a width $b=30$ μm. The curve 20 corresponds to a width $b=1$ mm and shows that the insertion losses are increased very appreciably. FIG. 5 does not show the insertion losses applicable to a microtape having a width $b=900$ μm since these losses exceed 70 dB throughout the range of frequencies. Thus, the insertion losses of the pair of microtapes having a width $b=n\lambda$ in which n is a strictly positive integer, are very substantial, and this very selective absence of coupling effect will be exploited in accordance with the invention as a transparency window for filtering the magnetostatic waves.

It remains to be verified that the utilization of a microtape of a width $b=n\lambda$ leads to effective coupling at large wavelengths.

Figure 6:
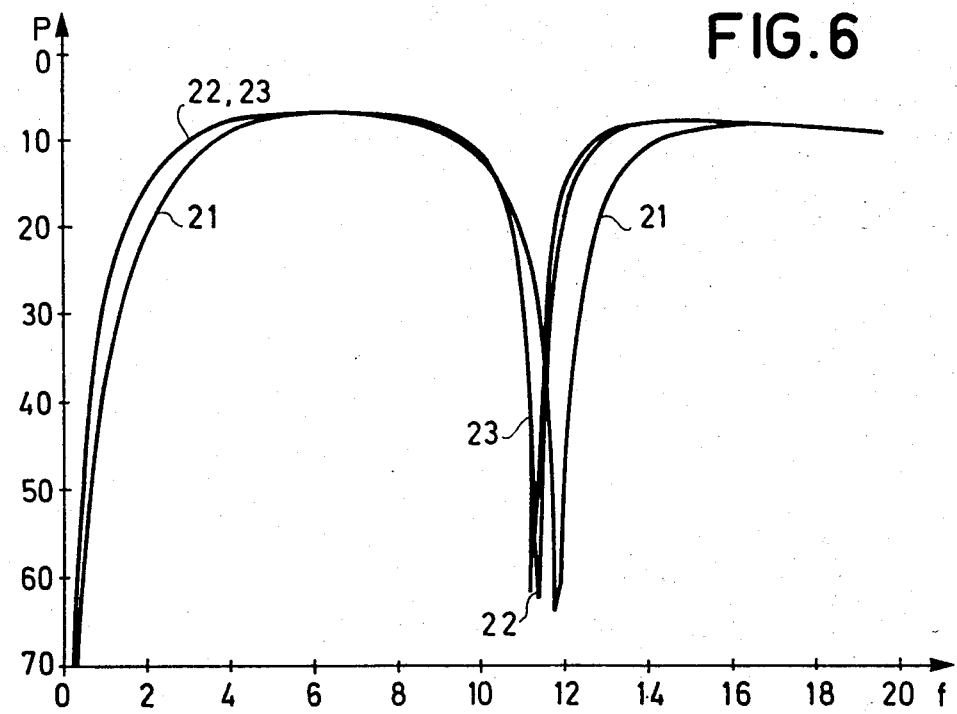

FIG. 6 shows the insertion losses P of a pair of microtapes of width $b=900$ μm placed on an insulating layer 12 of which the thickness h assumes three values. The wavelength is selected equal to 1 meter and the other parameters are: $d=20$ μm, $t=500$ μm, $L_1=3$ mm and $L_2=4.5$ mm.

The curve 21 corresponds to a thickness $h=900$ μm. The curve 22 corresponds to a thickness $h=30$ μm. The curve 23 is based on the assumption of transducers installed flush with the magnetic layer. Upon comparing these curves, it is apparent that the thickness h has little influence at great wavelengths on the effectiveness of the coupling action.

The device according to the invention operates appropriately if a dielectric 12 having a thickness $h=200$ μm for example, is placed between the microtapes and the YIG layer 11.

Figure 7:
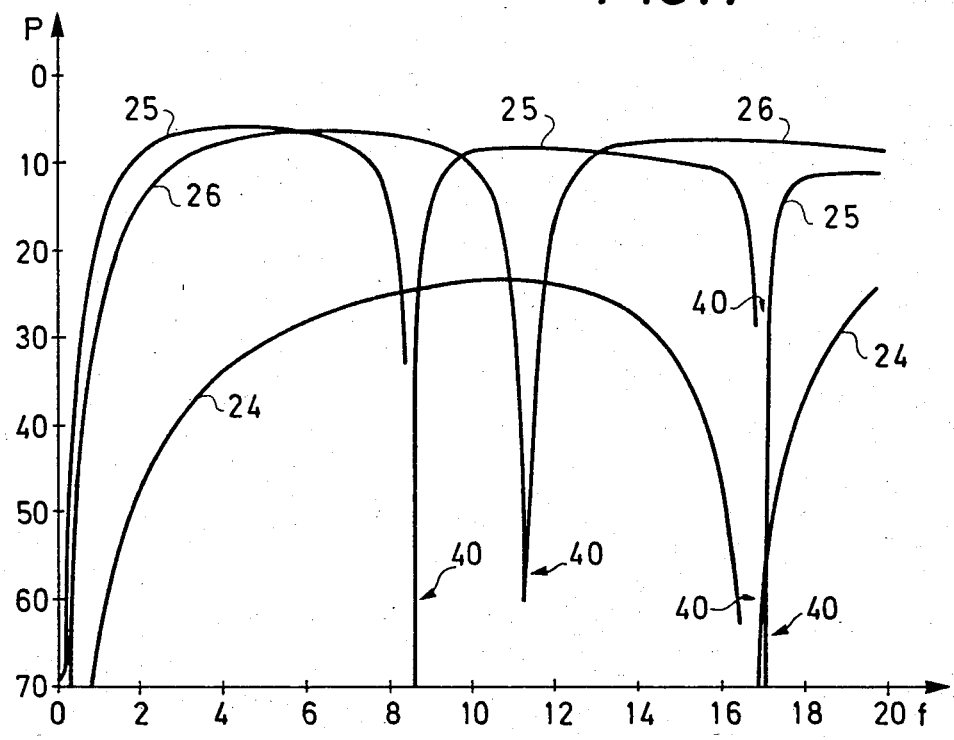

To conclude, FIG. 7 shows the insertion losses P of a pair of microtapes for a microstatic wavelength of 1 meter whilst causing variation of the lengths $L_1$ and $L_2$ of the component parts of the microtapes. The other parameters are: $d=20$ μm, $t=500$ μm, $b=900$ μm and $h=0$.

The curve 24 corresponds to a length $L_1=0.1$ mm and a length $L_2=3.05$ mm. The curve 25 corresponds to a length $L_1=6$ mm and a length $L_2=6$ mm. The curve 26 corresponds to a length $L_1=3$ mm and a length $L_2=4.5$ mm.

Microtapes having a length $L_1$ which is great are preferably utilized. The selection of $L_1$ should allow for local increases of insertion losses caused by stationary wave phenomena along the microtapes. As a matter of fact, these should lie outside the range of wavelengths which are required to be covered by the filter device according to the invention. Similarly, the length $L_2$ of the microtapes is selected so that the local increases of the insertion losses do not fall within this frequency range.

The filter device according to the invention makes use of a microtape to intercept the magnetostatic waves of great wavelength by providing a negligible coupling action with respect to magnetostatic waves of which the wavelength is a submultiple of the width b. The energy of the effectively coupled waves is eliminated by terminating the microtape in a matched resistive load. Another solution consists in utilizing microtapes which are produced from a dissipating material, for example chromium. The microtape is advantageously formed by a stack of thin chromium layers separated by dielectric layers, for example of glass. A modified form of the invention is obtained by alternate atomisations of a metal of high resistivity and of a dielectric.

In the devices according to the invention utilizing transducers formed by multiple layers, the thickness h of the dielectric 12 taken into account in the calculations is the distance separating the surface of the YIG 11 from the first layer of metal of high resistivity.

Figure 8:
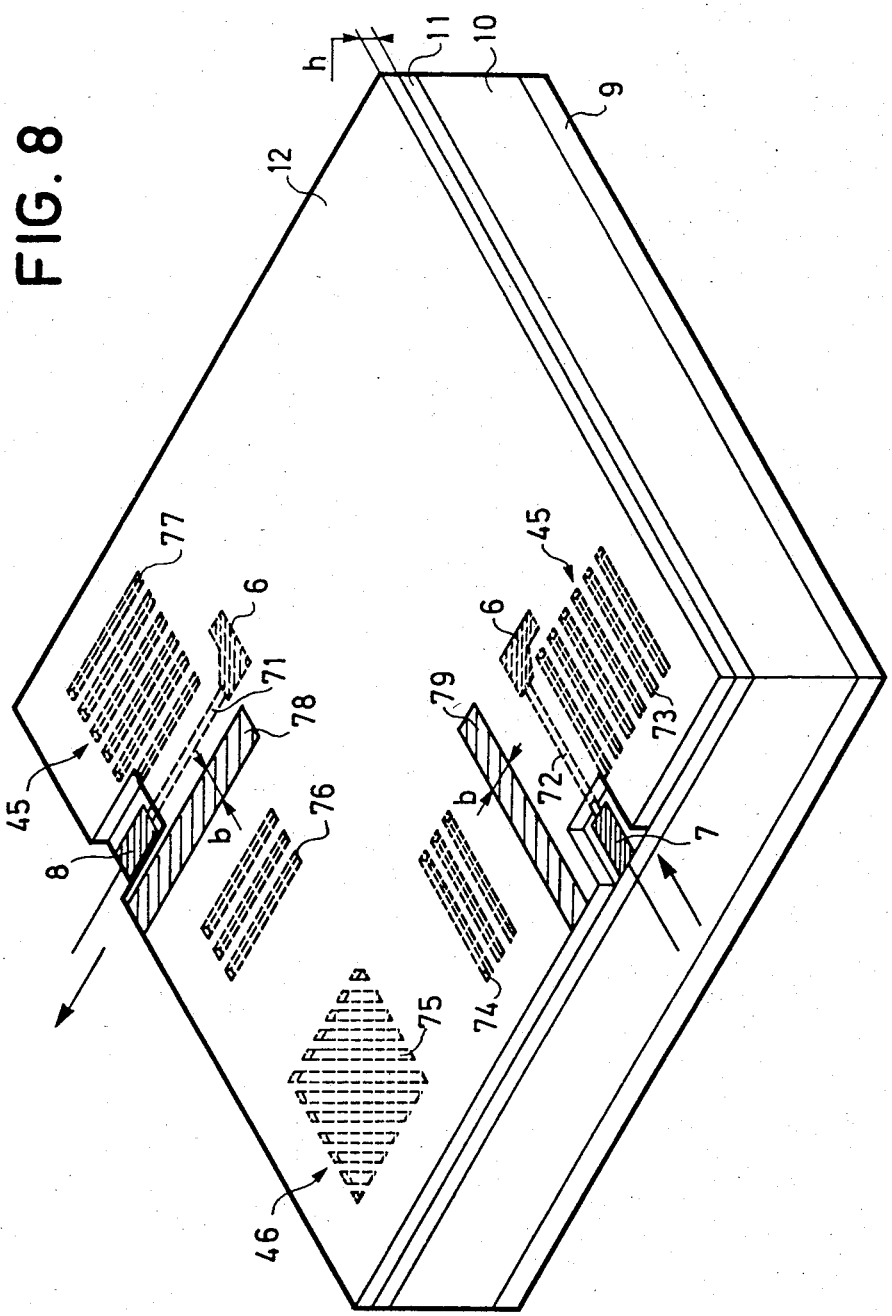
FIG. 8 is an isometric view of one embodiment of filter device according to the invention.

In FIG. 8 is shown a resonator utilizing "forward" magnetostatic volume waves equipped with filter microtapes according to the invention. As stated above, a device of this kind has been described in French patent application filed by the applicants on the Dec. 31, 1981 under the national registration No. 81 24561. In the example of FIG. 8, the input and output transducers are transmitting and receiving microtapes 72 and 71 illustrated by dashed lines, which connect the input and output terminals 7 and 8 to metal terminations 6 which may form the electrical earth of the device. The device is produced by starting from a block 10 of GGG, with a YIG layer 11 deposited on its surface. The transmitter and receiver microtapes are situated at the surface of the YIG layer in resonant cavities 45 delimited by reflector networks. The grooves forming these networks are machined into the YIG layer 11. A reflector network 46 which also comprises grooves cut into the YIG layer 11 is arranged to reflect the magnetostatic waves coming from one cavity 45 towards the other cavity. Between the input and output terminals 7 and 8, the device of FIG. 8 may be considered as a filter permitting selection of a wavelength $\lambda_r$. This selection is the result of the resonant cavities 45 in which the networks of grooves 73,74,76 and 77 establish longitudinal modes of which one corresponds to the wavelength $\lambda_r$ of the required function. In order to complete this selection, the grooves 75 of the return or reflector network 46 are arranged for reflection, at the wavelength $\lambda_r$, of the waves emerging from the network of grooves 74 towards the network of grooves 76. Thus, the two resonant cavities 45 are coupled by a selective means. For further improvement of the selection of the wavelength $\lambda_r$, the structure of FIG. 8 is coated with the dielectric layer 12 on which are arranged the filter devices according to the invention. As stated above, these devices comprise microtapes 78 and 79 of which the width b is a multiple of the wavelength $\lambda_r$. In the case of FIG. 8, the microtapes 78 and 79 are made of chromium, in order to dissipate the electrical energy which they hold, when the wavelength of the magnetostatic waves varies from the wavelength $\lambda_r$ required. The number and position of the microtapes may be determined in each case in accordance with the geometry of the device and the required degree of damping of the waves of great magnetostatic wavelength.

The different filter microtapes do not necessarily have the same width b. For example, use may be made of a microtape of a width $3\lambda_r$, and of two microtapes of a width of $5\lambda_r$. The resonator of FIG. 8 may be converted into a tunable oscillator of particularly high performance by adding an external amplifying means connecting the terminals 7 and 8. The tuning operation, for example between 2.5 and 7 GHz, is performed by varying the magnetic field H.

Figure 9:
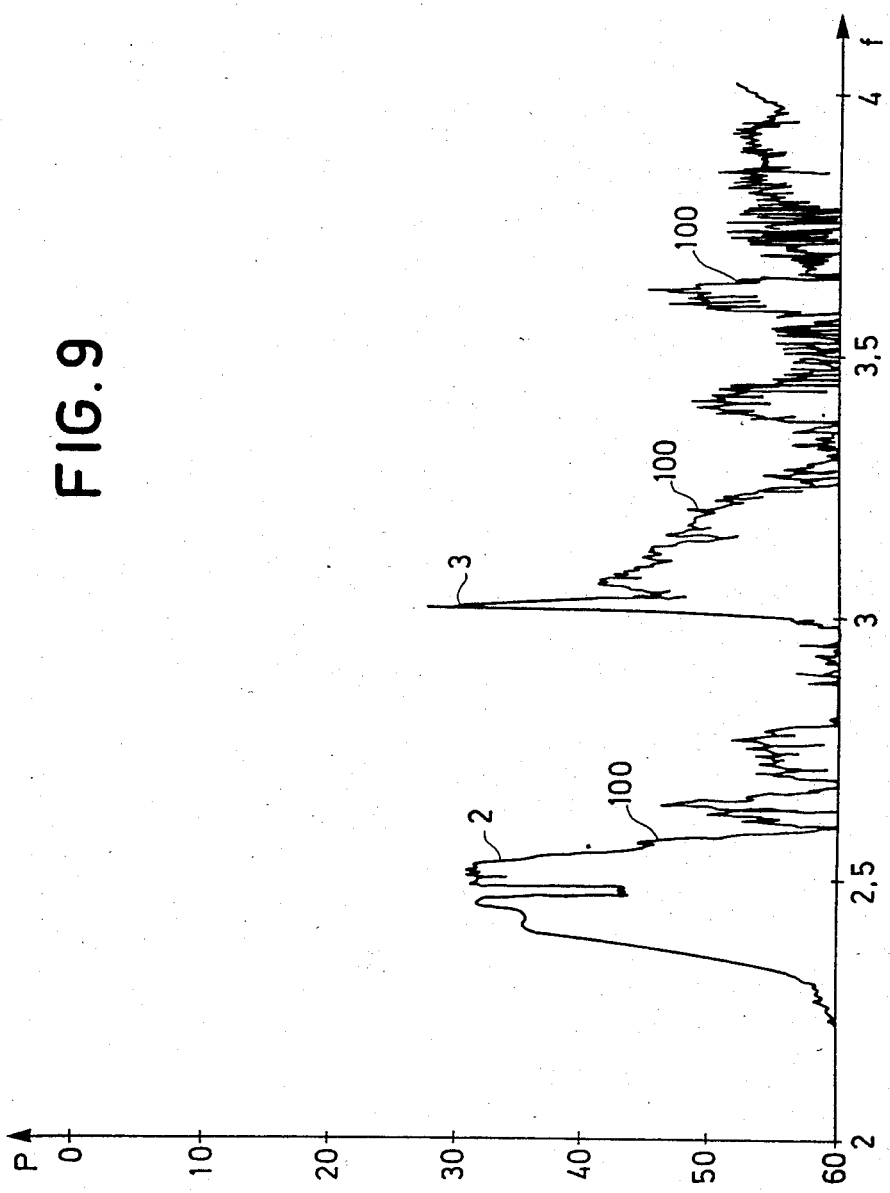
FIG. 9 is an explanatory diagram.

FIG. 9 shows the transfer function 100 of a resonator equipped with the filters according to the invention. This transfer function has been obtained at constant magnetic field H. The peak 3 corrresponding to the resonance wavelength $\lambda_r$ is practically unaffected by the presence of the filter microtapes. By contrast, the peak 2 corresponding to interference signals of great wavelength is reduced by 17 dB as compared to what it would be without the filter device.

The curve of FIG. 9 was obtained for a structure such as that shown in FIG. 8 of the filter microtapes placed above the network forming resonant cavities 45.

Figure 10:
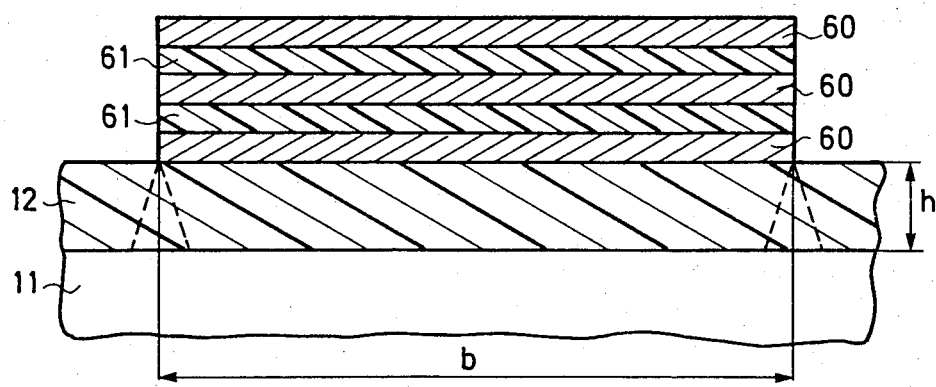
FIG. 10 is an explanatory arrangement.

FIG. 10 is a view in partial cross-section of a filter device according to the invention.

The presence of the dielectric layer 12 between the YIG layer 11 and the layers 60 forming the filter microtape has the effect that the width b is not precisely equal to a multiple of the wavelength $\lambda_r$. Allowance should be made for an edge effect denoted in FIG. 10 by the areas delimited by the dashed lines starting from the edges of the metal layer 60. The device of FIG. 10 comprises a stack of alternate layers of metal 60 and dielectric 61.

The invention is not limited to the magnetostatic volume waves and is also applicable to the devices utilising magnetostatic surface waves.

The device according to the invention is applicable in particular to the resonators, oscillators and delay lines operating with magnetostatic waves.

Obviously, numerous modifications and variations of the present invention are possible in light of the above teachings. It is therefore to be understood that within the scope of the appended claims, the invention may be practiced otherwise than as specifically described herein.

We claim:

1. A filter device for magnetostatic waves of predetermined wavelength, these magnetostatic waves being propagated in a magnetic layer epitaxied on a non-magnetic layer, comprising:
   at least one filter microstrip positioned along the path of the said waves, the width of the said microstrip being equal to a multiple of the wavelength which is to be selectively transmitted; and
   dissipating means associated with the said microstrip for dissipating the energy originating from the interaction of the magnetostatic waves with the said filter microstrip.

2. A device according to claim 1, further comprising:
   a dielectric layer between the said microstrip and the magnetic layer.

3. A device according to claim 1, wherein said magnetostatic waves are transmitted by transducer devices situated on the said magnetic layer, each of the said transducer devices being formed by a microstrip forming the middle part of a conductive element deposited on the said magnetic layer, and wherein a terminal extremity of each transducer is connected to ground and another transducer extremity is an electrical input with the other terminal extremity of the other transducer used an an electrical output.

4. A device according to claim 3, wherein the outermost part of one transducer device are positioned at right angles to the outermost part of the other transducer device.

5. A device according to claim 3, wherein at least one of the microstrip is situated within a resonant cavity delimited by two reflector networks.

6. A device according to claim 5, wherein two microstrips are respectively situated in two resonant cavities delimited by reflector networks, a reflector network being arranged to reflect towards the one of the resonant cavities the magnetostatic waves emerging from the other of the said resonant cavities.

7. A device according to claim 6, wherein said filter microstrips are located between the reflector networks forming each of the said resonant cavities.

8. A device according to claim 1, wherein the dissipation of the energy originating from the interaction of the magnetostatic waves with the said filter microstrips is effected by the electrically conductive material from which it is produced.

9. A device according to claim 8, wherein the said electrically conductive material is selected from the group of chromium, nickel, or a chromium alloy.

10. A device according to claim 8, wherein the said electrically conductive material is divided into superposed layers separated by a dielectric.

* * * * *